United States Patent [19]
Uenoyama et al.

[11] Patent Number: 5,973,357
[45] Date of Patent: *Oct. 26, 1999

[54] NON-VOLATILE MEMORY ELEMENTS

[75] Inventors: Hiromi Uenoyama; Junichi Hikita, both of Kyoto, Japan

[73] Assignee: Rohm Co., Ltd., Kyoto, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/047,121

[22] Filed: Mar. 24, 1998

[30] Foreign Application Priority Data

Mar. 28, 1997 [JP] Japan ................................. 9-078029

[51] Int. Cl.$^6$ ................................................. H01L 29/788
[52] U.S. Cl. ........................... 257/321; 257/314; 257/316; 257/319
[58] Field of Search ......................... 257/314, 316, 257/319, 321

[56] References Cited

U.S. PATENT DOCUMENTS

| | | | |
|---|---|---|---|
| 5,569,945 | 10/1996 | Hong | 257/316 |
| 5,672,892 | 9/1997 | Ogura et al. | 257/314 |
| 5,753,525 | 5/1998 | Hsu et al. | 437/43 |
| 5,753,946 | 5/1998 | Naiki et al. | 257/295 |
| 5,760,435 | 6/1998 | Pan | 257/314 |

*Primary Examiner*—Valencia Martin-Wallace
*Attorney, Agent, or Firm*—Majestic, Parsons Siebert & Hsue P.C.

[57] ABSTRACT

A non-volatile memory element, which includes a transistor and stores data by changing its threshold voltage, includes a semiconductor substrate, an electrically chargeable floating gate electrode layer above the main surface of the substrate, another electrically chargeable floating gate electrode layer above the main surface of the substrate, and a control gate electrode layer above these floating gate electrode layers, separated from them by an insulating film such that the voltage of the control gate electrode layer controls charged conditions of the floating gate electrode layers which are insulated from each other and disposed along the direction of the current flow in the transistor.

6 Claims, 3 Drawing Sheets

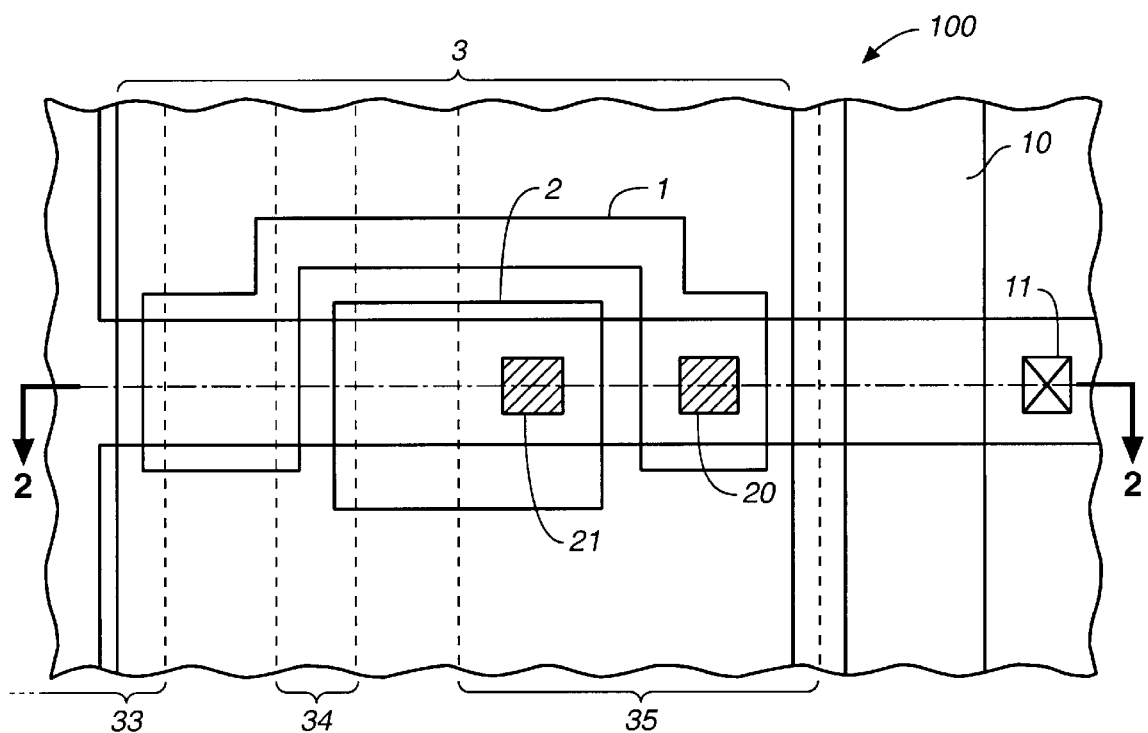
FIG._1
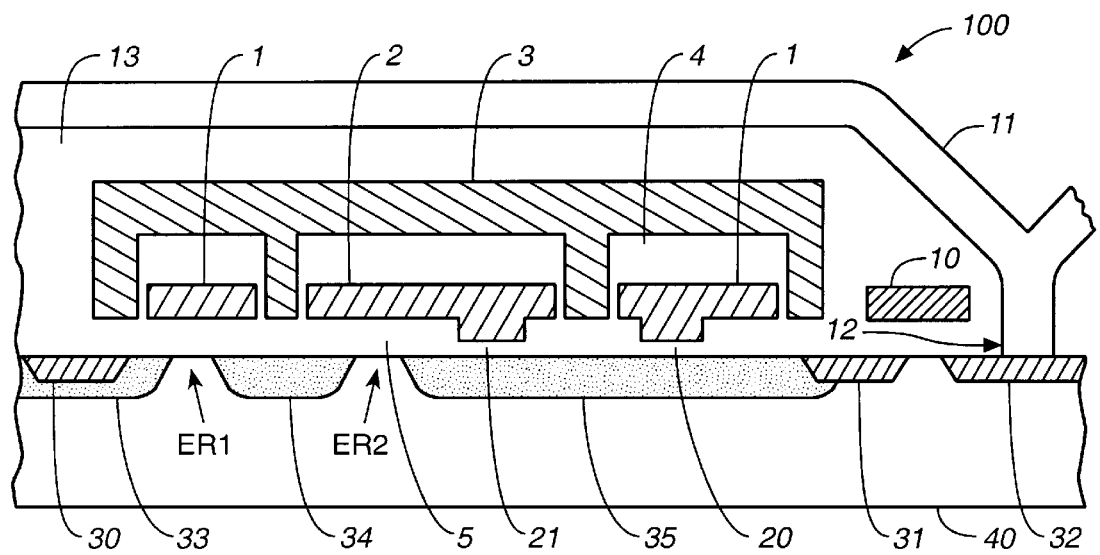
FIG._2

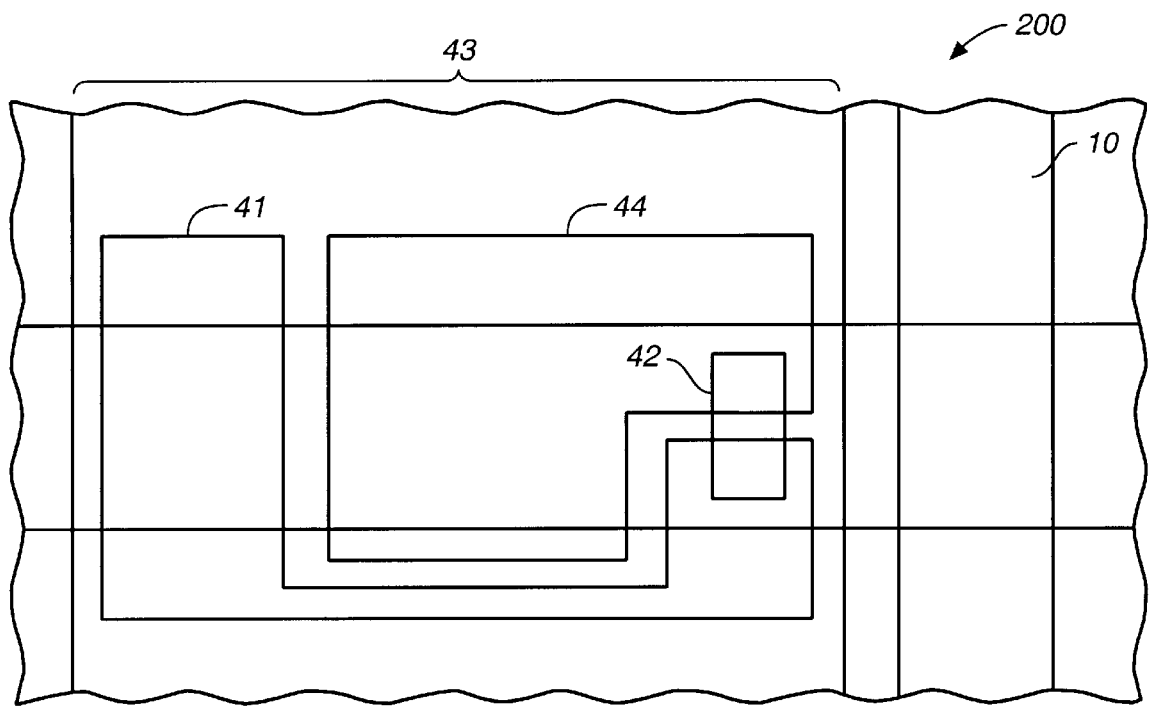
FIG._3
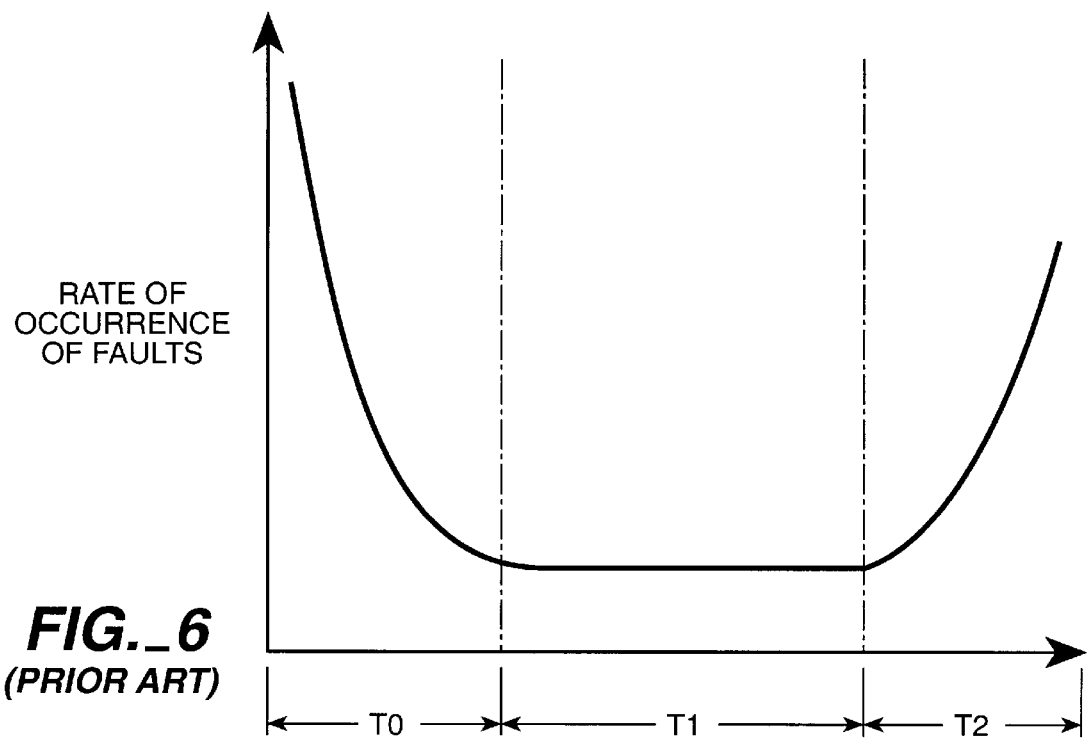
FIG._6
(PRIOR ART)

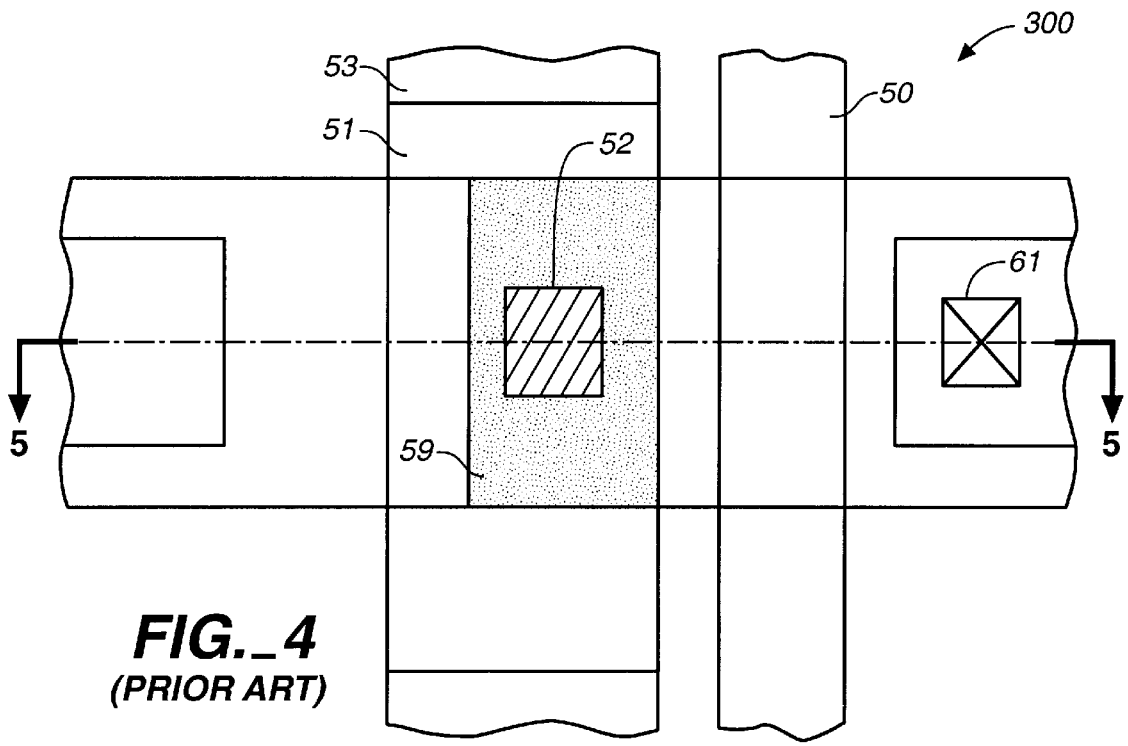
FIG._4
*(PRIOR ART)*
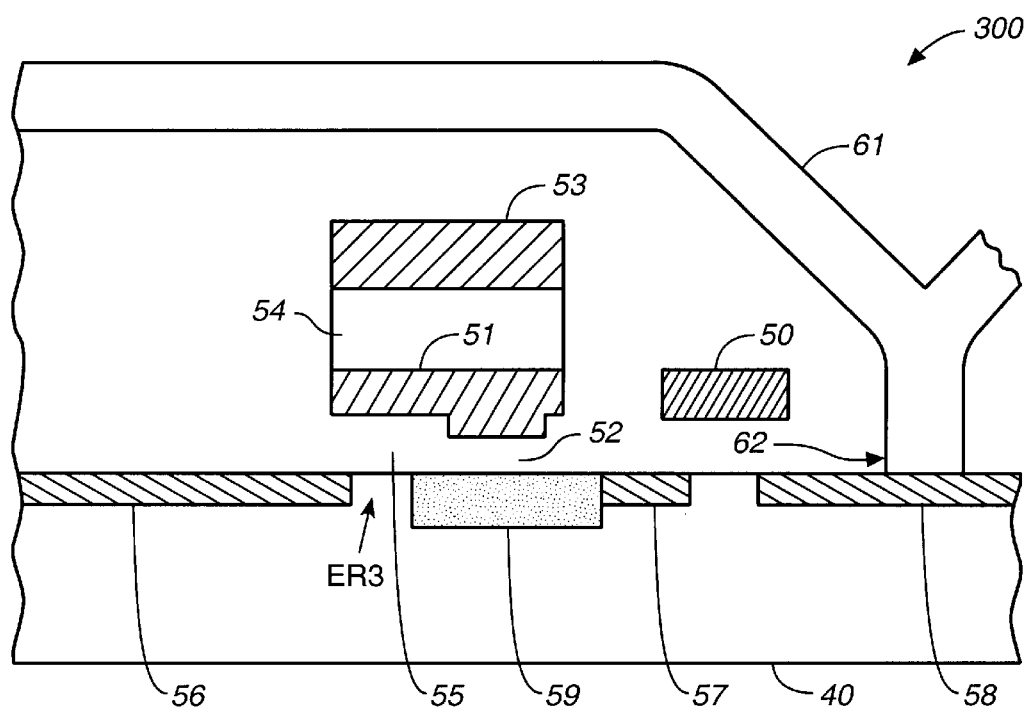
FIG._5
*(PRIOR ART)*

NON-VOLATILE MEMORY ELEMENTS

BACKGROUND OF THE INVENTION

This invention relates to non-volatile memory elements, and more particularly to highly reliable non-volatile memory elements capable of reducing the rate of occurrence of defective data retention.

FIG. 4 is a plan view, showing the basic structure, of a prior art non-volatile memory element 300, as an example of semiconductor memory element capable of electrically writing and erasing data, which comprises an EEPROM of the so-called FLOTOX (floating gate tunnel oxide) type. FIG. 5 is a sectional view taken along line 5—5 of FIG. 4, showing the memory element 300 as comprising a floating gate electrode layer 51, a control gate electrode layer 53, an insulating inter-layer film 54, an insulating film 55, a tunnel oxide film 52, source/drain regions 56, 57 and 58 and an impurity diffusion region 59. The source-drain regions 56, 57 and 58 and the impurity diffusion region 59 are formed at specified intervals on the main surface of a p-type silicon substrate 40. The floating gate electrode layer 51 is formed over the area from the the source/drain region 56 to the impurity diffusion region 59 with the insulating film 55 in between. The control gate electrode layer 53 is formed above the floating gate electrode layer 51 with the insulating inter-layer film 54 in between. The floating gate electrode layer 51 has a protruding part which is formed above the impurity diffusion region 59 with the tunnel oxide film 52 in between.

In addition, the memory element 300 also comprises a selection gate 50 and a bit line 61. The selection gate 50 is formed over the region from the source/drain region 57 to the source/drain region 58. The region sandwiched between the source/drain regions 57 and 58 becomes conductive and non-conductive in accordance with the signal inputted to the selection gate 50. The source/drain region 58 has a contact opening 62 formed for taking out the voltage and is connected to the bit line 61 therethrough. The data item stored in the transistor of which the floating gate electrode layer 51 and the control gate electrode layer 53 are constituents is outputted to an external peripheral device through the bit line 61.

The non-volatile memory element 300 thus structured has the following three operating modes: "write", "erase" and "read". A data item is stored according to the condition of charge on the floating gate electrode layer 51. Charging and discharging of the floating gate electrode layer 51 are carried out by the F-N (Fowler-Nordheim) tunnel current through the tunnel oxide film 52.

In the erase mode, a (high) erase voltage VPP is applied to the control gate electrode layer 53 and the selection gate 50 and the bit line 61 is grounded at the same time such that the source/drain region 58 is kept at the ground potential. As a result, electrons are injected from the impurity diffusion region 59 to the floating gate electrode layer 51, and the floating gate electrode layer 51 becomes negatively charged. This causes the threshold voltage Vth of the memory transistor formed below the control gate electrode layer 53 to become higher. This condition will be hereinafter referred to as the erased condition ("1"). In the write mode, the control gate electrode layer 53 is kept at the ground potential and a high voltage is applied to the selection gate 50 and the source/drain region 58. As a result, the electrons accumulated in the floating gate electrode layer 51 are ejected to the impurity diffusion region 59 and the floating gate electrode layer 51 becomes positively charged. This causes the threshold voltage Vth to become lower, and this condition will be referred to as the written condition ("0").

In the read mode, an intermediate voltage between the threshold voltages Vth in the erased and written conditions is applied to the control gate electrode layer 53. If the floating gate electrode layer 51 is in the positively charged condition ("0"), a channel is formed in the region ER3 between the impurity diffusion region 59 and the source/drain region 56. If the floating gate electrode layer 51 is in the negatively charged condition ("1"), no channel will be formed in the region ER3. Thus, the conditions "0"(wherein the region ER3 is conductive) and "1" (wherein the region ER3 is non-conductive) can be read out, depending on the current which flows through the bit line 61 when a voltage is applied to the control gate electrode layer 53.

In summary, the prior art memory element 300 stores information by using a tunnel current to change the charged condition of the floating gate electrode layer 51. In order to inject and discharge electrons into and from the floating gate electrode layer 51; however, it is necessary to apply a high voltage. If write and erase processes are repeated many times, therefore, the tunnel oxide film 52 suffers from a voltage stress, and this causes its degradation and destruction and gives rise to the problem of defective data retention because the electrons injected into the floating gate electrode layer 51 leak out through the tunnel oxide film 52.

FIG. 6 shows the relationship between faulty operations and the frequency of use for such a prior art non-volatile memory element, the vertical axis representing the rate of occurrence of faulty operations and the horizontal axis representing the frequency of use. This curve is sometimes referred to as a bathtub curve, of which the part corresponding to the initial period indicated by symbol $T_0$ may be referred to as the initial fault period. The faults which appear relatively early during this period immediately after the use is started are primarily caused by the production processes. The second period indicated by symbol $T_1$ may be referred to as the accidental fault period. The faults which take place during this period are those which come about sporadically and relatively soon after the initial fault period. The rate of occurrence of faults is determined by the design and represents the reliability which is peculiar to the product. The final period indicated by symbol $T_2$ may be referred to as the wear fault period in which the number of faults increases with time, caused by wear and tear as well as material fatigue phenomena inclusive of the destruction of the tunnel oxide film 52. FIG. 6 shows that there is a rapid increase in the number of faults due to the destruction of the tunnel oxide film of a prior art non-volatile memory element according to the frequency of its use. In other words, prior art memory elements of this type fail to store data reliably after they are used very frequently. This affects the reliability of the memory device using such elements.

SUMMARY OF THE INVENTION

It is therefore an object of this invention in view of the above to provide highly reliable non-volatile memory elements such that the occurrence of faults in data storage can be reduced.

A non-volatile memory element according to this invention, with which the above and other objects can be accomplished, may be characterized as including a transistor, serving to store data by changing its threshold voltage and comprising a semiconductor substrate, an electrically chargeable floating gate electrode layer (herein referred to as "the first floating gate electrode layer") above the main surface of the substrate, another electrically chargeable floating gate electrode layer (herein referred to as "the second floating gate electrode layer") above the main surface of the substrate and insulated from the first floating gate electrode layer, and a control gate electrode layer above the first floating gate electrode layer and the second floating gate electrode layer, separated from them by an insulating film such that the voltage of the control gate electrode layer controls charged conditions of the first and second floating gate electrode layers, the first and second floating gate electrode layers being disposed along the current direction of the transistor.

Such a non-volatile memory element may further comprise an impurity diffusion region (herein referred to as "the first impurity diffusion region") inside the transistor at the main surface of the substrate, an oxide film (herein referred to as "the first oxide film") between the first impurity diffusion region and the first floating gate electrode layer, and another oxide film (herein referred to as "the second oxide film") between the first impurity diffusion region and the second floating gate electrode layer. The first floating gate electrode layer emits and receives electrical charges (electrons) through this first oxide film (as an tunnel current) and the second floating gate electrode layer emits and receives electrical charges (electrons) through this second oxide film (as another tunnel current). There is a channel-forming area (herein referred to as "the first channel-forming area") in which a channel may be formed, depending on the charged condition of the first floating gate electrode layer and another channel-forming area (herein referred to as the "second channel-forming area"), which is formed between the first channel-forming area and the first impurity diffusion region and in which a channel may be formed, depending on the charged condition of the second floating gate electrode layer.

There may also be formed another impurity diffusion region (herein referred to as "the second impurity diffusion region") inside the transistor at the main surface and still another oxide film (herein referred to as "the third oxide film") above the second floating gate electrode layer and the second floating gate electrode layer. The first and second floating gate electrode layers emit and receive electrical charges (electrons) through an tunnel current which passes through this third oxide film.

The ratio between the capacitance formed between the first floating gate electrode layer and the control gate electrode layer and the capacitance formed between the first floating gate electrode layer and the main surface may be the same as or different from the ratio between the capacitance formed between the second floating gate electrode layer and the control gate electrode layer and the capacitance formed between the second floating gate electrode layer and the main surface. The area of the firstfloating gate electrode layer and that of the second floating gate electrode layer may be same or different.

A non-volatile memory element according to this invention may also be characterized as comprising a semiconductor substrate, a first impurity diffusion region formed on the main surface of this substrate, a second impurity diffusion region formed also on this main surface but separated from the first impurity diffusion region, a plurality of floating gate electrode layers having gaps mutually therebetween and formed above an intermediate region between the first and second impurity diffusion regions, and a control gate electrode layer formed above these floating gate electrodes with an insulating film in between. Such a memory element may be further characterized as additionally comprising still another impurity diffusion region ("the third impurity diffusion region") in the intermediate region such that these floating gate electrode layers emit and receive electrical charges (electrons) through tunnel currents which pass through regions ("common regions") between these floating gate electrode layers and the third impurity diffusion region.

In these examples, the insulating film may be of a three-layer structure with two silicon oxide films and a silicon nitride film or comprise a ferroelectric material.

A method of this invention for making such a non-volatile memory element, having a transistor and storing data by varying threshold voltage of this transistor, may be characterized as comprising the steps of forming an insulating film over a main surface of a semiconductor substrate, forming impurity diffusion regions ("the first impurity diffusion region" and "the second impurity diffusion region") on the main surface of the substrate and still another impurity diffusion region ("the third impurity diffusion region") between the first and second impurity diffusion regions, forming an oxide film above the first through third impurity diffusion regions, forming a floating gate electrode layer ("the first floating gate electrode layer") above this oxide film between the second and third impurity diffusion regions, forming between the first and third impurity diffusion regions a charge-passing region through which electrons are emitted from and received by the first floating gate electrode layer, and forming another floating gate electrode layer ("the second floating gate electrode layer") between the third impurity diffusion region and this charge-passing region.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings:

FIG. 1 is a plan view of a non-volatile memory element embodying this invention for schematically showing its basic structure;

FIG. 2 is a sectional view of the non-volatile memory element of FIG. 1 taken along line 2—2 therein;

FIG. 3 is a plan view of another non-volatile memory element embodying this invention;

FIG. 4 is a plan view of a prior art non-volatile memory element for schematically showing its basic structure;

FIG. 5 is a sectional view of the prior art non-volatile memory element of FIG. 4 taken along line 5—5 therein; and FIG. 6 is a graph which schematically shows the relationship between the occurrence of fealty operations by a prior art non-volatile memory element and the frequency of its operations.

DETAILED DESCRIPTION OF THE INVENTION

Non-volatile memory elements according to a first embodiment of this invention may be characterized as preventing the occurrence of faulty memory retention by means of a plurality of floating gate electrode layers. FIGS. 1 and 2 show the basic structure of such a non-volatile memory element 100, comprising floating gate electrode layers 1 and 2 (herein respectively referred to as "the first floating gate electrode layer 1" and "the second floating gate electrode layer 2"), a control gate electrode layer 3, an insulating inter-layer film 4, an insulating film 5, source/drain regions 30, 31 and 32 and impurity diffusion regions 33, 34 and 35. The source/drain regions 30, 31 and 32 and the impurity diffusion regions 33, 34 and 35 are formed on the main surface of a p-type silicon substrate 40 at specified intervals. The second floating gate electrode layer 2 is formed above the area ranging from the impurity diffusion region 34 to the impurity diffusion region 35 with the insulating film 5 in between while the first floating gate electrode layer 1 is formed above the area over the impurity diffusion regions 33, 34 and 35, as better shown in FIG. 1, with the insulating film 5 in between. The control gate electrode layer 3 is formed above the floating gate electrode layers 1 and 2 with the insulating inter-layer film 4 in between.

The floating gate electrode layers 1 and 2 each have a downward protrusion. The protrusion from the first floating gate electrode layer 1 is formed above the impurity diffusion region 35 with a tunnel oxide film 20 in between. The protrusion from the second floating gate electrode layer 2 is formed also above the impurity diffusion region 35 with another tunnel oxide film 21 in between.

As shown in FIGS. 1 and 2, the memory element 100 further comprises a selection gate 10, a bit line 11 and another insulating film 13. The selection gate 10 is formed above the area ranging from the source/drain region 31 to the source/drain region 32. The source/drain region 32 has a contact opening 62 formed thereon for taking out the voltage and is connected to the bit line 11 therethrough. The insulating film 13 is formed so as to cover the control gate electrode layer 3.

The non-volatile memory element 100 stores a data item according to the charge conditions of its floating gate electrode layers 1 and 2. Charging and discharging of the floating gate electrode layers 1 and 2 are carried out by the F-N tunnel currents through the tunnel oxide films 20 and 21. In the erase mode, electrons are injected into the floating gate electrode layers 1 and 2. This is done by applying an appropriate erase voltage VPP to the control gate electrode layer 3 and the selection gate 10 and grounding the bit line 11 such that the source/drain region 32 is at the ground potential. As a result, electrons are injected as a F-N tunnel current from the impurity diffusion region 35 to the floating gate electrode layers 1 and 2 such that the floating gate electrode layers 1 and 2 become negatively charged. Thus, when an appropriate read voltage is applied to the control gate electrode layer 3 at the time of the read mode of operation, both the region sandwiched between the impurity diffusion regions 33 and 34 (hereinafter referred to as "the first channel-forming area ER1") and the region sandwiched between the impurity diffusion regions 34 and 35 (hereinafter referred to as "the second channel-forming area ER2") become non-conductive. In other words, the memory element 100 remains in the erased condition "1".

If there has been an occurrence of defective data retention (say, due to an electron leak) at one of the floating gate electrode layers (say, 1) and the read voltage is applied to the control gate electrode layer 3 under such a condition, the first channel-forming area ER1 will become conductive but the other of the floating gate electrode layers (say, 2) remains negatively charge unless it also has failed to retain its electrons. Thus, the second channel-forming area ER2 will remain in the non-conductive condition even if the read voltage is applied to the control gate electrode layer 3. In other words, the non-volatile memory element 100 as a whole remains in the non-conductive condition even if the read voltage is applied to the control gate electrode layer 3 at the time of the read mode of operation and continues to remain in the erased condition "1". It now goes without saying that the same effect is obtained if a failure in data retention occurs in the other of the floating gate electrode layers (say, 2).

In summary, since two floating gate electrode layers 1 and 2 are disposed as shown in FIGS. 1 and 2 with gaps therebetween in the direction in which a current of electrons will flow, a failure of data retention may occur in one of them (such as 1) but the memory element 100 as a whole can continue to hold the data item as long as the other of the floating gate electrode layers (such as 2) is normal.

The first floating gate electrode layer 1 and the control electrode layer 3 may be considered to form a capacitor with capacitance $C_1$ together with the insulating inter-layer film 4 therebetween serving as a dielectric material. The first floating gate electrode layer 1 and the main surface of the substrate 40, on the other hand, may be considered to form another capacitor with capacitance $C_2$ together with the insulating film 5 and the tunnel oxide film 20 therebetween serving as dielectric materials. Similarly, the second floating gate electrode layer 2 and the control electrode layer 3 may be considered to form a capacitor with capacitance $C_3$ together with the insulating inter-layer film 4 therebetween serving as a dielectric material, and the second floating gate electrode layer 2 and the main surface of the substrate 40 may be considered to form still another capacitor with capacitance $C_4$ together with the insulating film 5 and the tunnel oxide film 21 therebetween serving as dielectric materials. Let us call the ratio $C_1/C_2$ "the first coupling ratio" and the ratio $C_3/C_4$ "the second coupling ratio". These coupling ratios control the field intensities within the tunnel oxide films 20 and 21 and the currents flowing therethrough. If the first and second coupling ratios are different, for example, the field strengths to which the tunnel oxide films 20 and 21 are subjected become different from each other, that is, the stress on one of the floating gate electrode layers (1 or 2) becomes lower than that on the other of the floating gate electrode layers (2 or 1). Thus, if the non-volatile memory element 100 is so designed that these two coupling ratios are different from each other, it is possible to make the rate of occurrence of faulty operations by one of its two floating gate electrode layers 1 and 2 lower than that by the other and to thereby improve the useful lifetime of the memory element 100 as a whole. One of the methods of causing the two coupling ratios to be different is to make the areas of the two floating gate electrode layers 1 and 2 different which are determining factors respectively of the capacitances $C_1$ and $C_3$.

The non-volatile memory element 100 described above, however, is not intended to limit the scope of the invention. Many modifications and variations are possible within the scope of this invention. FIG. 3 shows another example of non-volatile memory element 200 embodying this invention, which comprises two floating gate electrode layers 41 and 44, a control gate electrode layer 43 and a tunnel oxide film 42 but is different from the memory element 100 shown in FIGS. 1 and 2 wherein these two floating gate electrode layers 41 and 42 receive and emit electrons through the same tunnel oxide film 42. The memory element 200 thus structured, too, is capable of retaining data reliably as a whole even if an electron leakage has taken place in one of the floating gate electrode layers 41 or 44 as long as the other floating gate electrode layer 44 or 41 functions normally.

In summary, non-volatile memory elements according to this invention can prevent the occurrence of faulty data retention in the accidental fault period $T_1$ and the wear fault period $T_2$ explained above with reference to FIG. 6. Thus, the present invention also provides more reliable memory devices by using such improved non-volatile memory elements.

What is claimed is:

1. A non-volatile memory element comprising:

a semiconductor substrate with a main surface;

an electrically chargeable first floating gate electrode layer separated from and above said main surface;

an electrically chargeable second floating gate electrode layer separated from and above said main surface and separated and insulated from said first floating gate electrode layer;

a control gate electrode layer above said first floating gate electrode layer and said second floating gate electrode layer, separated from said first and second floating gate electrode layers by an insulating film;

a first impurity diffusion region, a second impurity diffusion region and a third impurity diffusion region which are mutually separated inside said semiconductor substrate at said main surface;

a first channel-forming area between said second impurity diffusion region and said third impurity diffusion region where a channel is formed, depending on the charged condition of said first floating gate electrode layer;

a second channel-forming area between said first impurity diffusion region and said second impurity diffusion region where a channel is formed, depending on the charged condition of said second floating gate electrode layer;

a first oxide film between said first impurity diffusion region and said first floating gate electrode layer; and a second oxide film between said first impurity diffusion region and said second floating gate electrode layer;

wherein said first floating gate electrode layer emits and receives electrical charges as a tunnel current which passes through said first oxide film, and wherein said second floating gate electrode layer emits and receives electrical charges as another tunnel current which passes through said second oxide film.

2. The non-volatile memory element of claim 1 wherein the ratio between first capacitance formed between said first floating gate electrode layer and said control gate electrode layer and second capacitance formed between said first floating gate electrode layer and said main surface is the same as the ratio between third capacitance formed between said second floating gate electrode layer and said control gate electrode layer and fourth capacitance formed between said second floating gate electrode layer and said main surface.

3. The non-volatile memory element of claim 1 wherein the ratio between first capacitance formed between said first floating gate electrode layer and said control gate electrode layer and second capacitance formed between said first floating gate electrode layer and said main surface is different from the ratio between third capacitance formed between said second floating gate electrode layer and said control gate electrode layer and fourth capacitance formed between said second floating gate electrode layer and said main surface.

4. The non-volatile memory element of claim 1 wherein said first floating gate electrode layer and said second floating gate electrode layer have the same area size.

5. The non-volatile memory element of claim 1 wherein said first floating gate electrode layer and said second floating gate electrode layer have different area sizes.

6. The non-volatile memory element of claim 1 wherein said insulating film comprises a ferroelectric material.

* * * * *